United States Patent
Hsieh et al.

(10) Patent No.: US 10,534,839 B2
(45) Date of Patent: Jan. 14, 2020

(54) METHOD FOR MATRIX BY VECTOR MULTIPLICATION FOR USE IN ARTIFICIAL NEURAL NETWORK

(71) Applicant: British Cayman Islands Intelligo Technology Inc., Grand Cayman (KY)

(72) Inventors: Pei-Wen Hsieh, Zhubei (TW);
Chen-Chu Hsu, Zhubei (TW);
Tsung-Liang Chen, Zhubei (TW)

(73) Assignee: BRITISH CAYMAN ISLANDS INTELLIGO TECHNOLOGY INC., Grand Cayman (KY)

( * ) Notice: Subject to any disclaimer, the term of this patent is extended or adjusted under 35 U.S.C. 154(b) by 3 days.

(21) Appl. No.: 16/017,813

(22) Filed: Jun. 25, 2018

(65) Prior Publication Data

US 2019/0012296 A1  Jan. 10, 2019

Related U.S. Application Data

(60) Provisional application No. 62/530,120, filed on Jul. 8, 2017.

(51) Int. Cl.
*G06F 17/16* (2006.01)
*G06N 3/063* (2006.01)
(Continued)

(52) U.S. Cl.
CPC ............ *G06F 17/16* (2013.01); *G06F 7/5443* (2013.01); *G06N 3/04* (2013.01); *G06N 3/0445* (2013.01);
(Continued)

(58) Field of Classification Search
CPC .............................. G06F 7/5443; G06F 17/16
(Continued)

(56) References Cited

U.S. PATENT DOCUMENTS 8,676,874 B2 * 3/2014 Fossum ................ G06F 17/16
 708/520
10,360,163 B2 * 7/2019 Woo .................... G06F 13/1668
(Continued)

OTHER PUBLICATIONS

S. Han, et al., EIE: Efficient Inference Engine on Compressed Deep Neural Network, 2106 ACM/IEEE 43rd Annual International Symposium on Computer Architecture, IEEE Computer Society, p. 243-254 (Year: 2016).*

*Primary Examiner* — Andrew Caldwell
*Assistant Examiner* — Emily E Larocque
(74) *Attorney, Agent, or Firm* — Muncy, Geissler, Olds & Lowe, P.C.

(57) ABSTRACT

A method for matrix by vector multiplication, applied in an artificial neural network system, is disclosed. The method comprises: compressing a plurality of weight values in a weight matrix and indices of an input vector into a compressed main stream; storing M sets of synapse values in M memory devices; and, performing reading and MAC operations according to the M sets of synapse values and the compressed main stream to obtain a number M of output vectors. The step of compressing comprises: dividing the weight matrix into a plurality of N×L blocks; converting entries of a target block and corresponding indices of the input vector into a working block and an index matrix; removing zero entries in the working block; shifting non-zero entries row-by-row to one of their left and right sides in the working block; and, respectively shifting corresponding entries in the index matrix.

11 Claims, 16 Drawing Sheets

(51) Int. Cl.
*H03M 7/30* (2006.01)
*G06N 3/04* (2006.01)
*G06F 7/544* (2006.01)
*G06F 5/01* (2006.01)

(52) U.S. Cl.
CPC .......... *G06N 3/0454* (2013.01); *G06N 3/063* (2013.01); *H03M 7/30* (2013.01); *H03M 7/3082* (2013.01); *G06F 5/01* (2013.01); *H03M 7/6023* (2013.01)

(58) Field of Classification Search
USPC .................................................. 708/501, 523
See application file for complete search history.

(56) References Cited

U.S. PATENT DOCUMENTS

| | | | |
|---|---|---|---|
| 2015/0067009 A1* | 3/2015 | Strauss | G06F 17/16 708/203 |
| 2018/0046437 A1* | 2/2018 | Lo | G06F 17/16 |
| 2018/0129935 A1* | 5/2018 | Kim | G06N 3/0454 |
| 2018/0157969 A1* | 6/2018 | Xie | G06N 3/063 |
| 2018/0253635 A1* | 9/2018 | Park | G06N 3/0454 |
| 2018/0275909 A1* | 9/2018 | Agrawal | G06F 17/16 |

* cited by examiner $$\text{block } W_b \begin{Bmatrix} w[0,0] & w[0,1] & w[0,2] & w[0,3] & \cdots & w[0,7] \\ w[1,0] & w[1,1] & w[1,2] & w[1,3] & \cdots & w[1,7] \\ w[2,0] & w[2,1] & w[2,2] & w[2,3] & \cdots & w[2,7] \\ w[3,0] & w[3,1] & w[3,2] & w[3,3] & \cdots & w[3,7] \\ & & \cdots & & & \\ w[7,0] & w[7,1] & w[7,2] & w[7,3] & \cdots & w[7,7] \end{Bmatrix} \times \underbrace{\begin{Bmatrix} x[0] \\ x[1] \\ x[2] \\ x[3] \\ \cdots \\ x[7] \end{Bmatrix}}_{\text{sub-vector } X_b} = \underbrace{\begin{Bmatrix} y[0] \\ y[1] \\ y[2] \\ y[3] \\ \cdots \\ y[7] \end{Bmatrix}}_{\text{sub-vector } Y_b}$$

FIG. 3A

FIG. 3B working index matrix D'

| 0 | 1 | 2 | 3 | 4 | 5 | 6 | 7 |
|---|---|---|---|---|---|---|---|
| 1 | 0 | 3 | 2 | 5 | 4 | 7 | 6 |
| 2 | 3 | 4 | 5 | 6 | 7 | 0 | 1 |
| 3 | 2 | 5 | 4 | 7 | 6 | 1 | 0 |
| 4 | 5 | 6 | 7 | 0 | 1 | 2 | 3 |
| 5 | 4 | 7 | 6 | 1 | 0 | 3 | 2 |
| 6 | 7 | 0 | 1 | 2 | 3 | 4 | 5 |
| 7 | 6 | 1 | 0 | 3 | 2 | 5 | 4 |

| w[0,0] | 0 | 0 | 0 | 0 | w[0,5] | 0 | 0 |
|---|---|---|---|---|---|---|---|
| w[1,1] | 0 | 0 | 0 | 0 | w[1,4] | 0 | 0 |
| 0 | 0 | 0 | w[2,5] | 0 | 0 | 0 | 0 |
| 0 | 0 | 0 | w[3,4] | 0 | 0 | 0 | 0 |
| 0 | w[4,5] | 0 | 0 | 0 | 0 | 0 | 0 |
| 0 | w[5,4] | 0 | 0 | 0 | 0 | 0 | 0 |
| 0 | 0 | w[6,0] | 0 | 0 | 0 | 0 | 0 |
| 0 | 0 | w[7,1] | 0 | 0 | w[7,2] | 0 | 0 | working block Wb'

FIG.5A

METHOD FOR MATRIX BY VECTOR MULTIPLICATION FOR USE IN ARTIFICIAL NEURAL NETWORK

CROSS-REFERENCE TO RELATED APPLICATION

This application claims priority under 35 USC 119(e) to U.S. Provisional application No. 62/530,120, filed on Jul. 8, 2017, the content of which is incorporated herein by reference in its entirety.

BACKGROUND OF THE INVENTION

Field of the Invention

The invention relates to data processing, and more particularly, to a method for sparse matrix by vector multiplication for use in any layer having multiple neurons with multiple inputs in an artificial neural network.

Description of the Related Art

An artificial neural network (ANN) is based on a collection of connected neurons. When processing and propagating input signals, the input values (also called "synapse values") supplied to the neuron's synapses are each modulated by the synapses' respective weight values. The effect of this process is to pass a portion of the synapse value through the synapse, which is proportional to the weight value. In this way, the weight value modulates the connection strength of the synapse. The result is then summed with the other similarly processed synapse values.

Matrix by vector multiplication (M×V) is a basic build block in artificial neural networks and deep learning applications. For instance, in a general ANN, a layer having a plurality of neurons with multiple inputs (i.e., each neurons having multiple inputs) performs a computation: b=f(Wa+v), where a is an input vector, b is an output vector, v is a bias, W is a weight matrix and f is a transfer function; thus, the layer having the neurons the with multiple inputs are implemented with M×V. In convolutional neural networks, fully connected (FC) layers are implemented with M×V, and a very high percentage of the connections are occupied by FC layers; in recurrent neural networks, M×V operations are performed on the new input and the hidden state at each time step, generating a new hidden state and an output.

In general, the M×V procedure is a complex procedure and consumes a lot of computational resources. In particular, the weight matrices that occur in a general ANN system are often very large and sparse. For example, for a typical FC layer like FC7 of VGG-16, the input vector is 4K long and the weight matrix is 4K×4K (16 M weight values). A matrix is called sparse when it contains a small amount of non-zero entries/elements. In a general ANN system, it takes much time operating on and transferring the large amount of zero entries in the sparse weight matrix, and requires a huge and redundant storage space for zero entries in the sparse weight matrix, which increases storage cost and reduces M×V operation efficiency.

The invention is directed towards providing improved efficiency in M×V operations for facilitating data processing in a general ANN system.

SUMMARY OF THE INVENTION

In view of the above-mentioned problems, an object of the invention is to provide a method for matrix by vector multiplication, capable of concurrently operating in conjunction with multiple synapse data streams and maximizing the MAC hardware utilization.

One embodiment of the invention provides a method for matrix by vector multiplication. The method for matrix by vector multiplication, applied in an artificial neural network system, comprises: compressing a plurality of weight values in a weight matrix and indices of an input vector into a compressed main stream; storing M sets of synapse values in M memory devices; and, performing reading and MAC operations according to the M sets of synapse values and the compressed main stream to obtain a number M of output vectors in parallel. The step of compressing comprises: dividing the weight matrix into a plurality of N×L blocks; converting entries of a target block and corresponding indices of the input vector into a working block and an index matrix; removing zero entries in the working block; shifting non-zero entries row-by-row to one of their left and right sides in the working block; respectively shifting corresponding entries in the index matrix; forming a compressed sub-stream according to the shifted working block and the shifted index matrix; and, repeating the steps of converting, removing, sequentially shifting the non-zero entries, respectively shifting the corresponding entries and forming until all the blocks are processed to form the compressed main stream. Here, a bit length for the entries of the index matrix for each block is $\log_2 L$, and L and N are even numbers.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3A shows an example of a weight block/sub-matrix Wb (8×8), an input sub-vector Xb (8×1) and an output sub-vector Yb (8×1).

FIG. 3B shows an 8×8 scalar matrix X' and an 8×8 index matrix D after entries and indices of the input sub-vector Xb in FIG. 3A are transformed.

FIG. 5A shows an example of a working block Wb' 520 and a working index matrix D' 310 after the entries of a target block 20 and related indices of input vector X are loaded and converted.

DETAILED DESCRIPTION OF THE INVENTION

As used herein and in the claims, the term "and/or" includes any and all combinations of one or more of the associated listed items. The use of the terms "a" and "an" and "the" and similar referents in the context of describing the invention are to be construed to cover both the singular and the plural, unless otherwise indicated herein or clearly contradicted by context.

A feature of the invention is to take advantage of weight sparsity of a weight matrix and fully relative indexing of an input vector X (corresponding to a set of synapse values) to compress entries of the weight matrix and indices of the input vector X into a compressed main stream. Another feature of the invention is that the compressed main stream is allowed to operate in conjunction with multiple synapse data streams (i.e., multiple sets of synapse values) concurrently, which facilitate data processing (i.e., the M×V operations) in a layer comprising multiple neurons with multiple inputs in a general ANN system. Another feature of the invention is to parallelize the M×V operations by a number N of identical multiplier-accumulators (MACs), where the number N of identical MACs is equal to the number N of synapse values read from a SRAM (static random access memory) device per clock cycle. Another feature of the invention is to maximize the MAC hardware utilization (with minimum MAC suspension due to zero entries in the weight matrix) by removing/skipping zero entries and shifting non-zero entries to their leftmost/rightmost blank positions in working blocks (e.g., Wb' in FIG. 3C) associated with the weight matrix. Another feature of the invention is to increase the compression ratio of the compressed main stream and minimize the storage space of a storage device 160 that stores the compressed main stream by (1) removing/skipping zero entries (step S416), (2) shifting non-zero entries to their leftmost/rightmost blank positions in the working blocks (step S418), (3) the "fully relative indexing" feature of the input vector X, (4) each index pair having a difference value of 1 in compresses index matrix D" and (5) compressing blank cells (step S435).

Figure 1A:
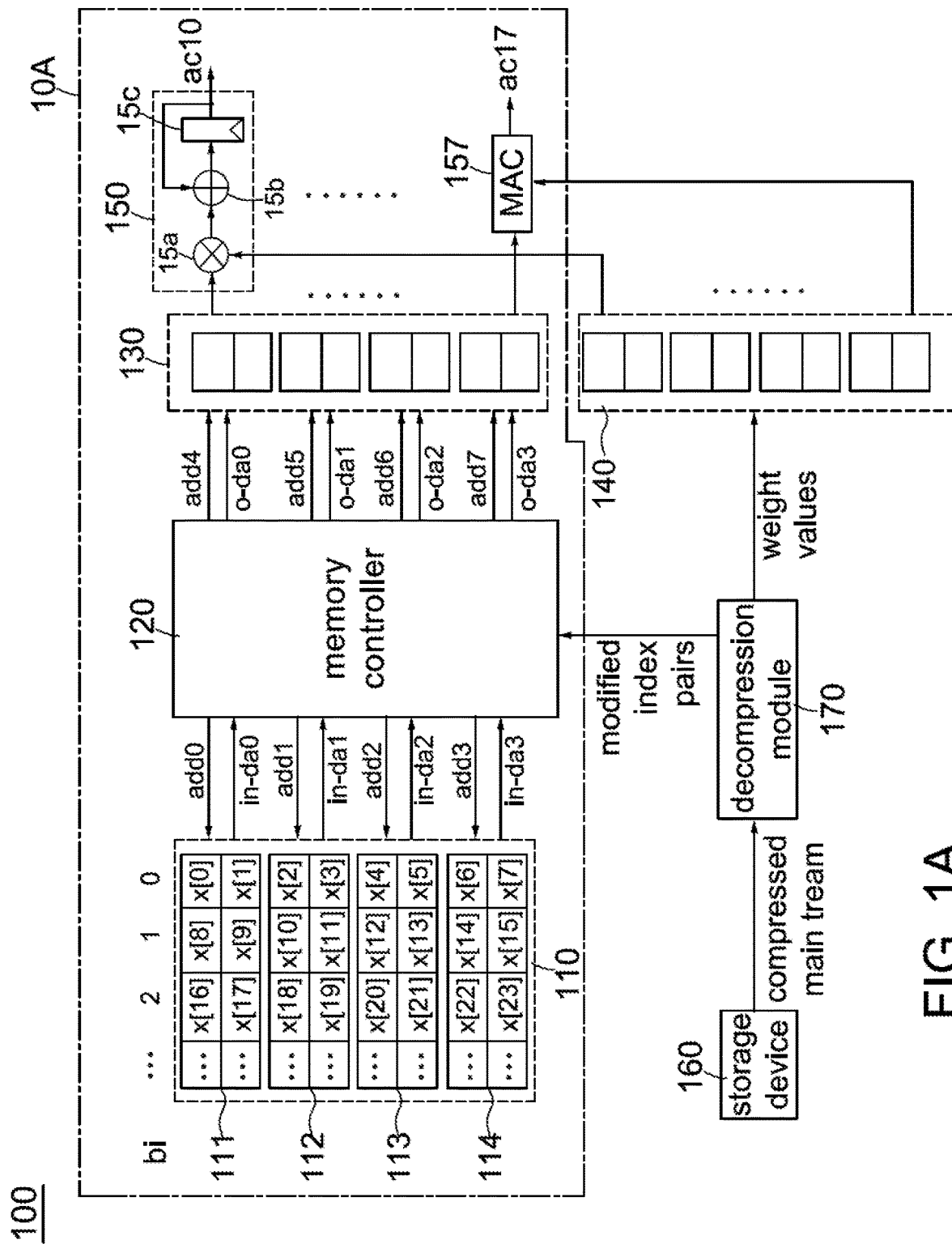
FIG. 1A is a schematic diagram of a computing apparatus for a single synapse data stream according to an embodiment of the invention.

FIG. 1A is a schematic diagram of a computing apparatus according to an embodiment of the invention. The computing apparatus 100 for matrix by vector multiplication (M×V), applicable to a layer comprising multiple neurons with multiple inputs (i.e., each neuron having multiple inputs) in a general ANN system, includes a fetch and calculation circuit 10A, a data buffer 140, a storage device 160 and a decompression module 170, where V is an input vector (corresponding to a set of synapse values) to the layer comprising the multiple neurons with the multiple inputs, and M refers to a matrix having multiple weight values of the connections to the layer's outputs. The fetch and calculation circuit 10A includes a SRAM device 110, a memory controller 120, a data buffer 130 and eight identical multiplier-accumulators (MACs) 150~157.

In this embodiment, the SRAM device 110 (that pre-stores a set of synapse values (corresponding to an input vector X)) is divided into four identical SRAM banks 111~114, and it is assumed that a 32-bit data (i.e., two synapse values) are allowed to be read out from each of the four SRAM banks 111~114 per clock cycle. Accordingly, the four SRAM banks 111~114 output eight synapse values concurrently per clock cycle. Please note that, as shown in FIG. 1A, in order to output the eight synapse values per clock cycle, the set of synapse values are pre-stored in the four SRAM banks 111~114 in an interleaved manner. Correspondingly, there are eight MACs 150~157 and there are four memory locations (each storing two values) for storing eight synapse values and eight weight values in the data buffers 130 and 140, respectively. Please also note that the eight synapse values per clock cycle are provided by example and not limitations of the invention. In an alternative embodiment, any other number of synapse values per clock cycle can be used depending on the design of SRAM banks.

Figure 1B:
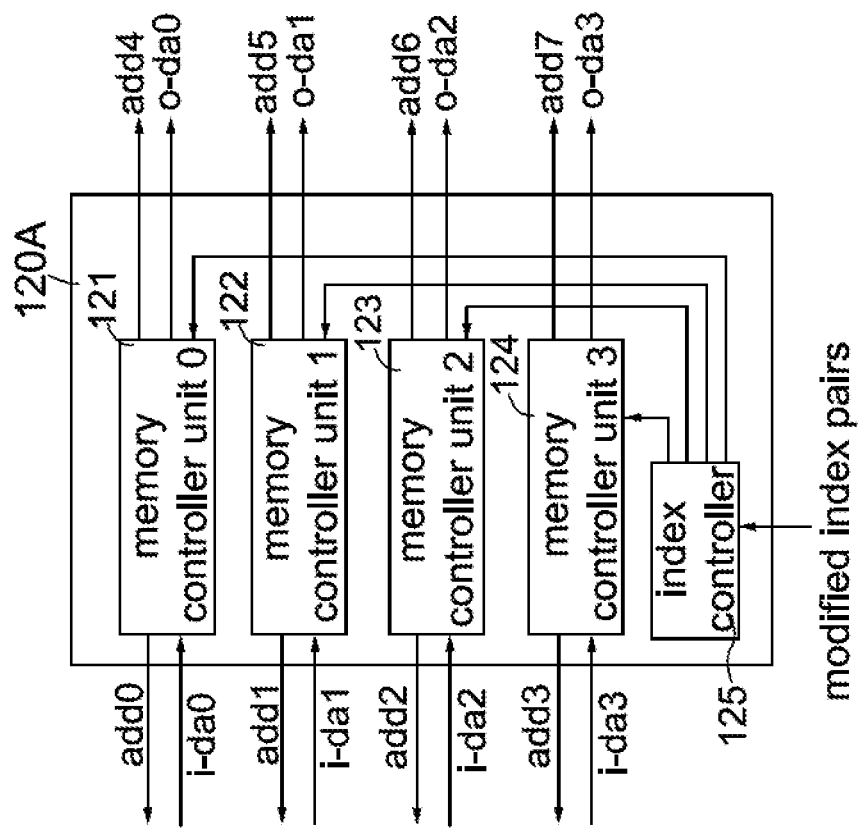
FIG. 1B is a block diagram of a memory controller with non-duplication configuration based on the computing apparatus of FIG. 1A.

According to this invention, the memory controller 120 is configured in one of two configurations, i.e., duplication configuration and non-duplication configuration, to perform read operations over the SRAM device 110 and to perform write operations over the data buffer 130 according to the modified index pairs. Referring to FIG. 1B, the memory controller 120A includes four memory controller units 121~124 and an index controller 125. In comparison with the memory controller 120A, the memory controller 120B in FIG. 1C additionally includes four data registers 126~129 for synapse value duplication. In other words, the memory controller 120A does not support synapse value (x value) duplication (called "non-duplication case/configuration") while the memory controller 120B supports synapse value duplication (called "duplication case/configuration"). Each of the MACs 150~157 is implemented using a multiplier 15$a$, an adder 15$b$ and an accumulator 15$c$. Throughout the specification, the same components with the same function are designated with the same reference numerals.

Figure 2:
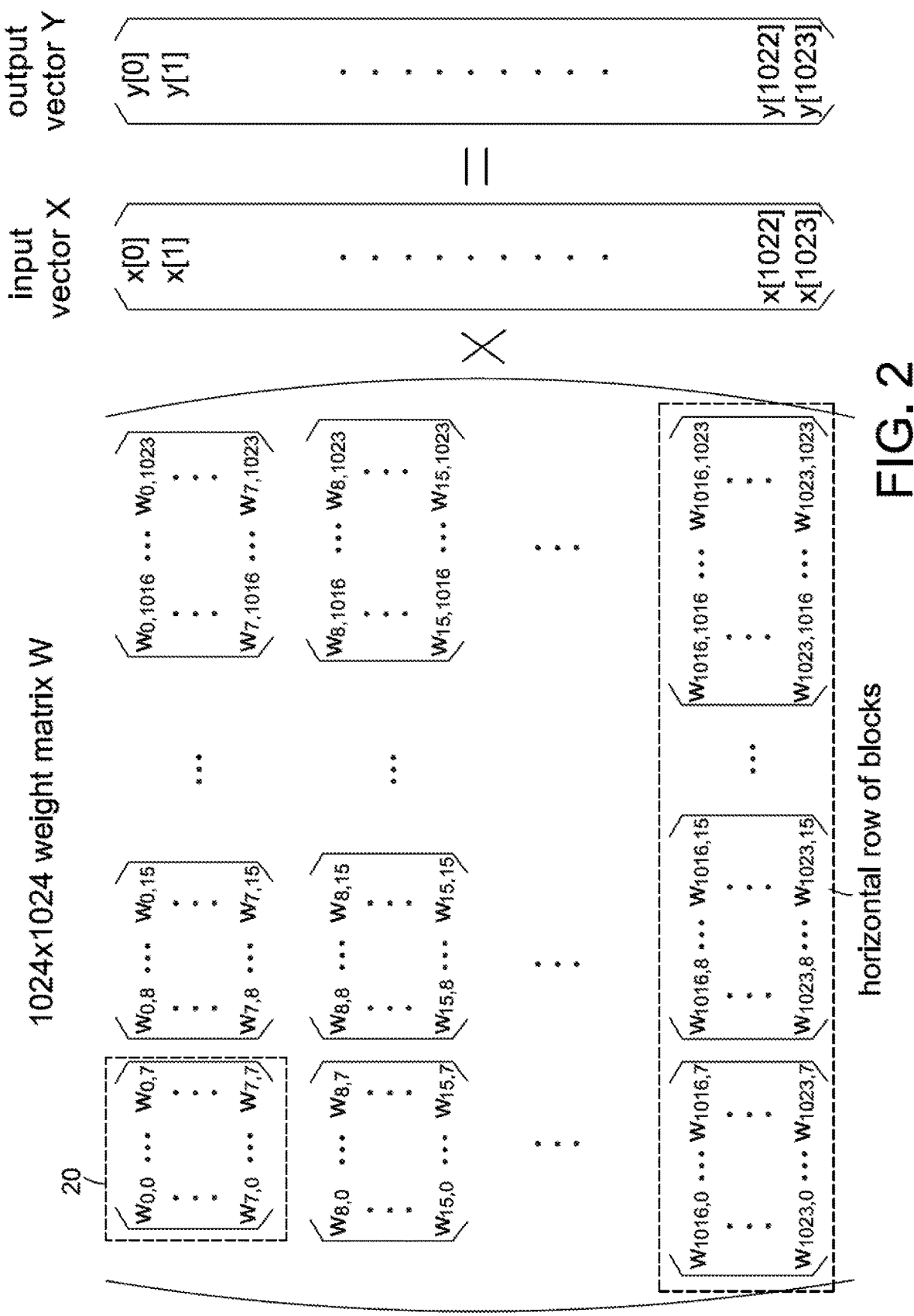
FIG. 2 shows an example of a weight matrix W having a size of 1024×1024, an input vector X having a size of 1024×1 and an output vector Y having a size of 1024×1.

Given that a weight matrix W has a size of 1024×1024, an input vector X has a size of 1024×1 and an output vector Y has a size of 1024×1 as the example shown in FIG. 2, the weight matrix W is divided into a regular grid composed of square 8×8 sub-matrices/blocks 20. After that, there are 128 (=1024/8) blocks 20 in a row or a column of the grid as shown in FIG. 2. The blocks 20 are processed one at a time. All blocks 20 in a horizontal row of the grid need to be processed before moving vertically in the grid. Each block 20 is related to a fragment of input vector X and a fragment of output Y. For example, the block 20 at the top-left corner of the grid is related to x[0,0]~x[7,0] and y[0,0]~y[7,0]. The following examples (FIG. 3A-3C) show how the block 20 at the top-left corner of the grid as well as their corresponding indices of input vector X in FIG. 2 are transformed for compression.

Please note that the size of the weight matrix W and the square 8×8 blocks 20 are provided by example and not limitations of the invention. In an alternative embodiment, any other size of the weight matrix W can be used depending on different applications. In another alternate embodiment, the weight matrix W is divided into multiple rectangular N×L sub-matrices/blocks, where N and L are even numbers. For purposes of clarity and ease of description, hereinafter, the following examples and embodiments will be described with the 1024×1024 weight matrix W and the square 8×8 blocks 20, unless otherwise indicated herein or clearly contradicted by context. FIG. 3A shows an example of a weight block/sub-matrix Wb (8×8), an input sub-vector Xb (8×1) and an output sub-vector Yb (8×1). For ease of expression, since the column sub-vector Xb has only eight entries x[0,0]~x[7,0] and the column sub-vector Yb has only eight entries y[0,0]~y[7,0], the eight entries x[0,0]~x[7,0] are respectively denoted as x[0]~x[7] and the eight entries y[0,0]~y[7,0] are respectively denoted as y[0]~y[7] in the specification and the drawings. As shown in FIG. 3A, the eight entries of a row of block Wb are multiplied by the eight entries of sub-vector Xb and summed to produce a corresponding entry of sub-vector Yb as described in equation 1:

$$y[i] = \Sigma_{k=0}^{7}(w[i,k]x[k]), \text{ for } i=0,\ldots,7.  \quad \text{Equation 1}$$

Figure 3B:
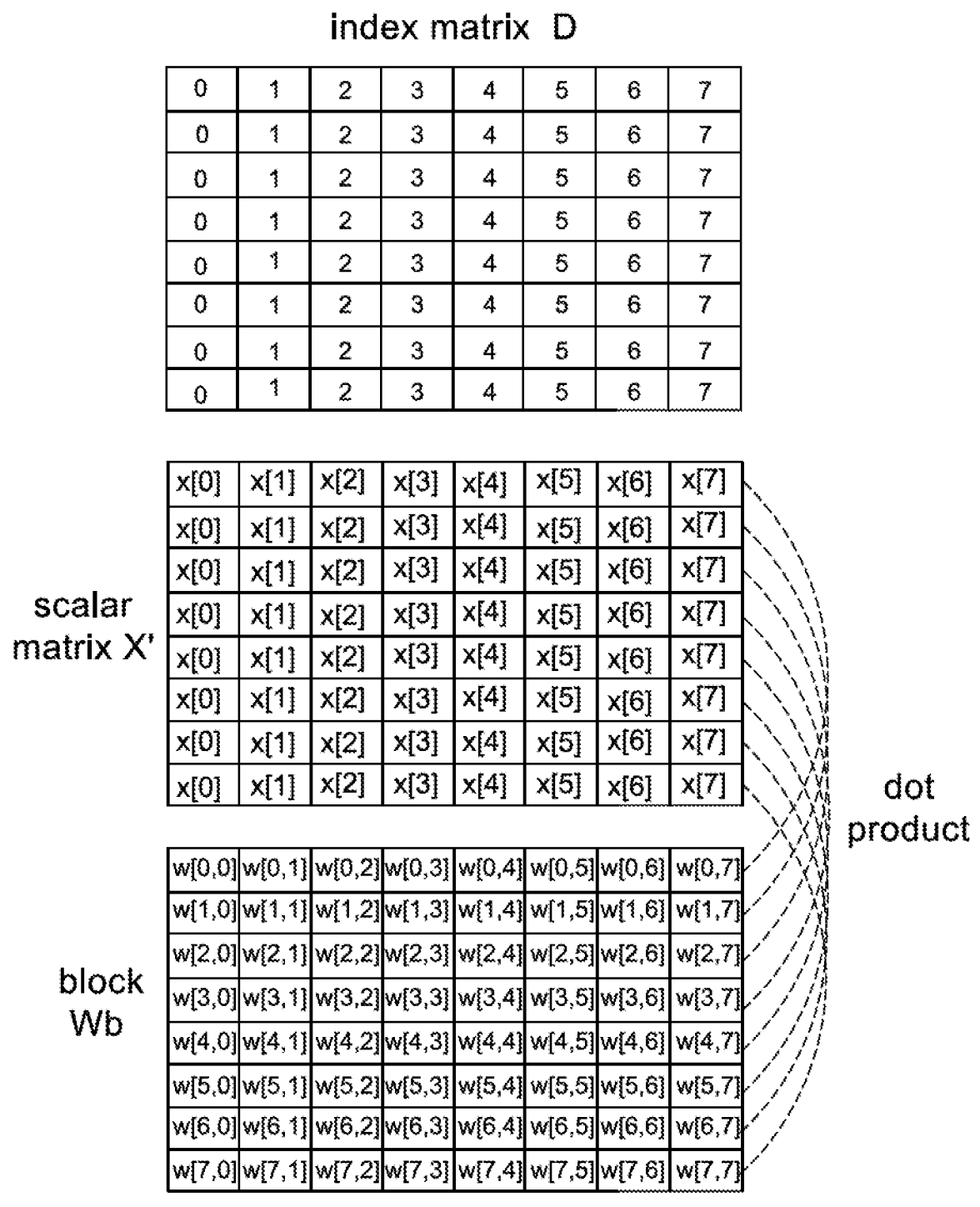

To parallelize the M×V operations by eight MACs (150~157), the entries and the indices 0~7 of the column sub-vector Xb are transformed into an 8×8 scalar matrix X' for dot-product operations and an 8×8 index matrix D for compression as shown in FIG. 3B. Accordingly, the entry y[i] of the product is obtained by multiplying entry-by-entry the entries of the $i^{th}$ row of block Wb and the $i^{th}$ row of matrix X', and summing these eight products. In other words, y[i] is the dot product of the $i^{th}$ row of sub-matrix Wb and the $i^{th}$ row of X', for i=0, . . . ,7. For example, y[0]=w[0,0]x[0]+w[0,1]x[1]+w[0,2]x[2]+w[0,3]x[3]+w[0,4]x[4]+w[0,5]x[5]+w[0,6]x[6]+w[0,7]x[7].

Figure 3C:
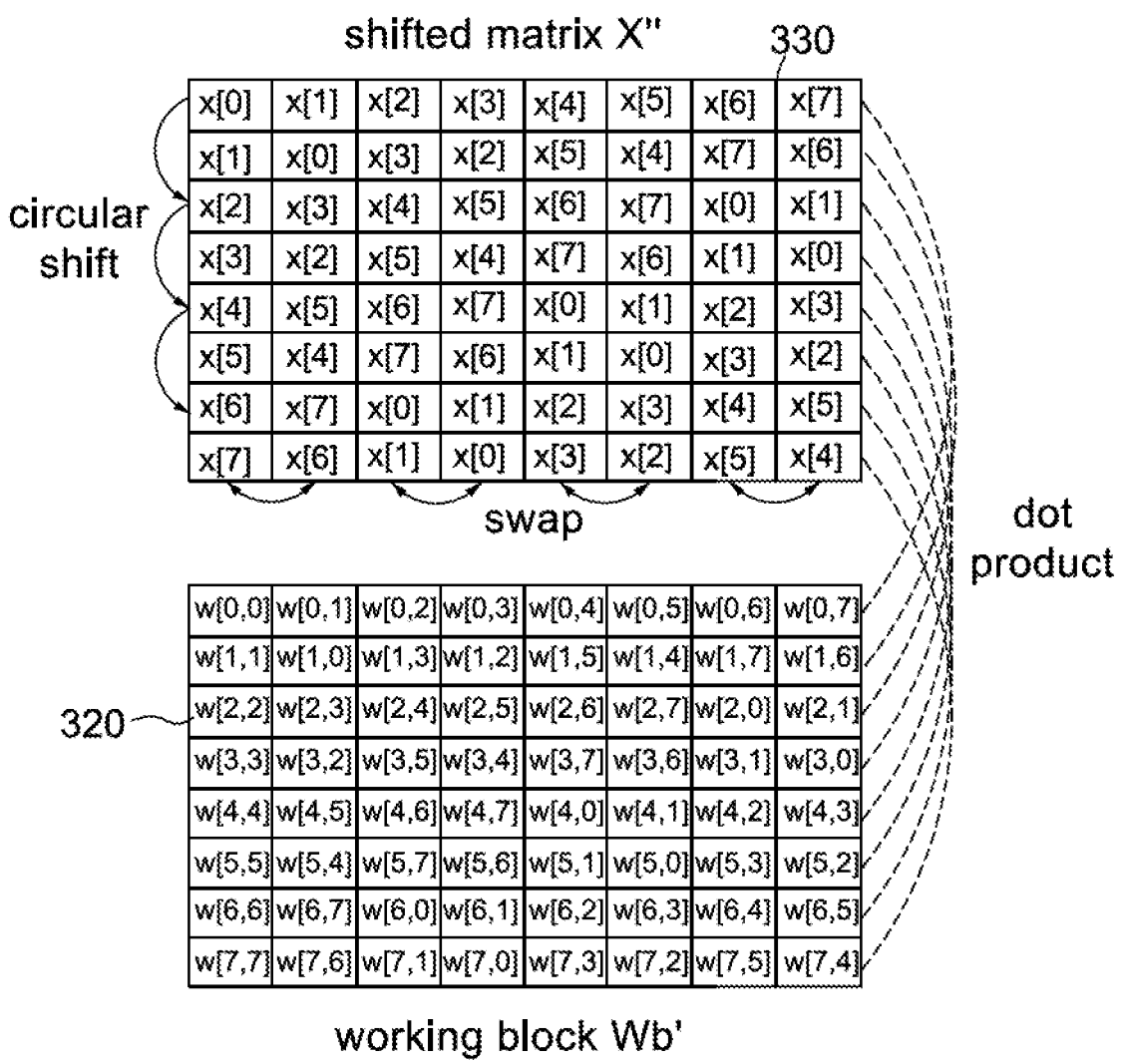
FIG. 3C shows a shifted matrix X", its corresponding working index matrix D' and working block Wb' according to the matrices X' and D in FIG. 3B.

It is assumed that eight synapse values x[0]~x[7] are concurrently read from the four SRAM banks 111~114 within one clock cycle. To make full use of the eight synapse values x[0]~x[7] and the eight MACs (150~157), the entries for each row/column of the scalar matrix X' are re-arranged to form a shifted matrix X" such that each column/row of X" contains all of the eight synapse values x[0]~x[7] as shown in FIGS. 3B and 3C. In one embodiment, the matrix X" 330 is formed by circular shifting the entries to left by two positions for each row-pair (of entries) with respect to their upper row-pair in X', and then swapping the two entries in each of four entry pairs for each odd row. Please note that there is a one-to-one position correspondence between entries of D and X' and there is a one-to-one position correspondence between entries of X' and Wb. Accordingly, since the positions of the entries of the matrix X" are changed with respect to X', the positions of the corresponding entries of Wb are also changed to form a working block Wb' 320 and the positions of the corresponding entries of D are also changed to form a working index matrix D' 310. For instance, because an entry x[6] at the $7^{th}$ row and the $6^{th}$ column in X' is moved to the position at the $7^{th}$ row and the first column in X", its corresponding entry w[7,6] is also moved from the $7^{th}$ row and the $6^{th}$ column in Wb to the position at the $7^{th}$ row and the first column in Wb', and its corresponding entry "6" is also moved from the $7^{th}$ row and the $6^{th}$ column in D to the position at the $7^{th}$ row and the first column in D'. As can be observed from FIG. 3C, after transformation, y[i] remains the dot product of the $i^{th}$ row of Wb' 320 and the $i^{th}$ row of X" 330, for i=0~7. Please also note that the one-to-one position correspondence also exists between entries of D' 310 and Wb' 320. According to the invention, the raw entries (weight values) of a target block 20 and the indices of its related fragment of input vector X in FIG. 2 have to be respectively converted to follow the formats of Wb' 320 and D' 310 prior to compression.

Figure 4A:
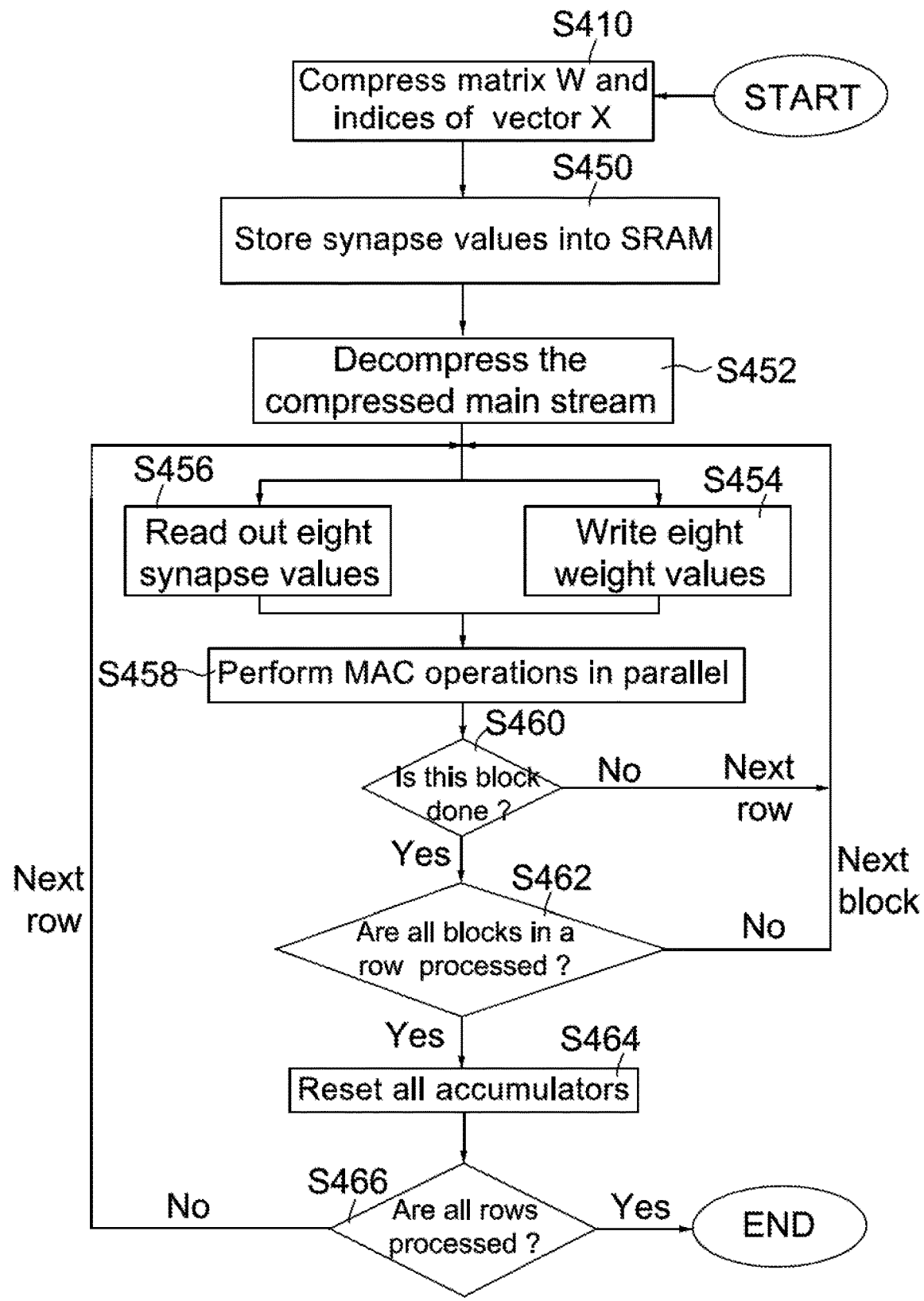
FIG. 4A is a flow chart showing a method performed by the computing apparatus 100 for matrix by vector multiplication according to the invention.

FIG. 4A is a flow chart showing a method performed by the computing apparatus 100 for matrix by vector multiplication according to the invention. Referring to FIGS. 1A-1C, 2 and 4A, the method for matrix by vector multiplication, applied in a layer comprising multiple neurons with multiple inputs in a general ANN system, is described as follows.

Step S410: Compress weight values of a weight matrix W and indices of an input vector X into a compressed main stream.

Figure 4B:
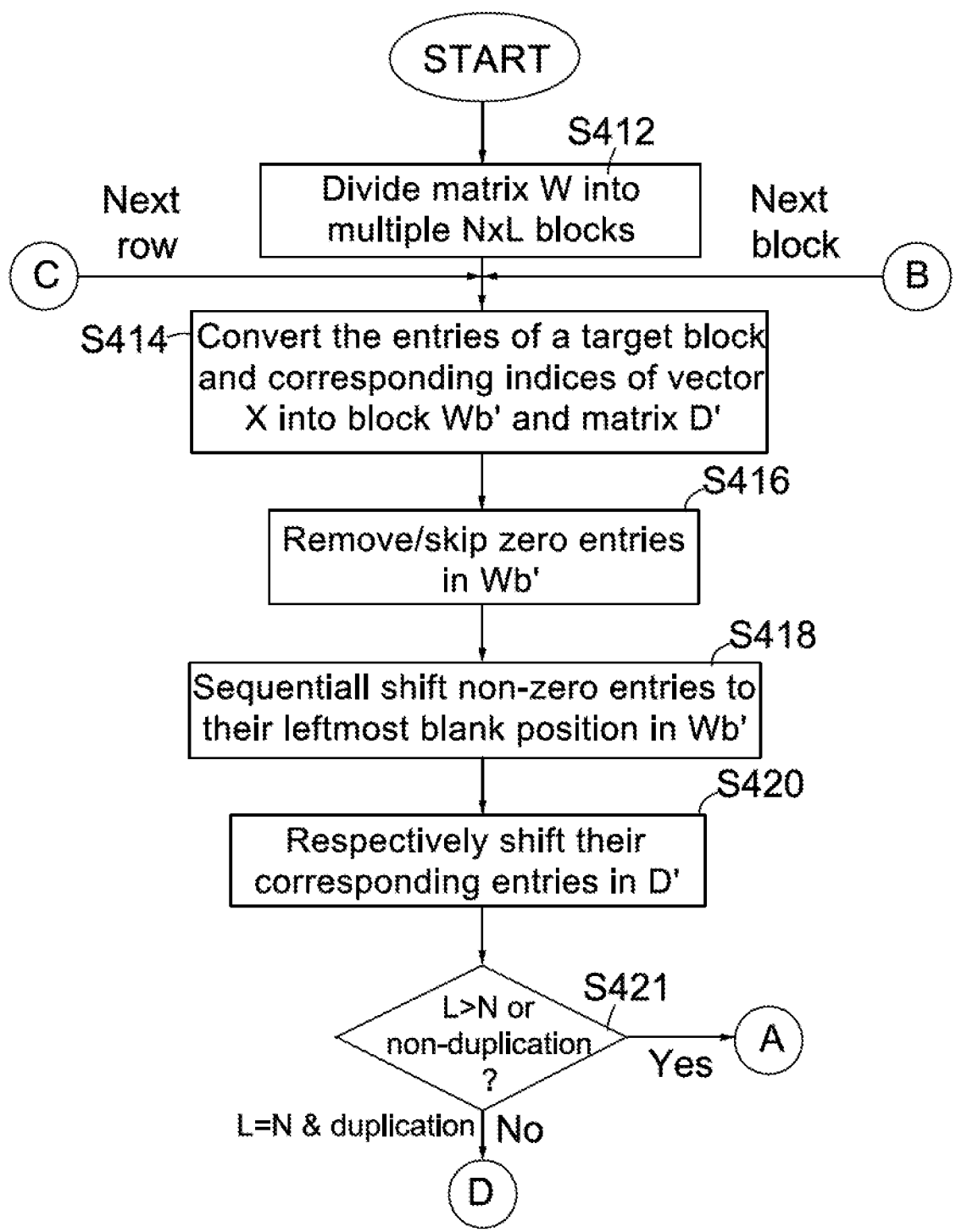
FIGS. 4B-4D show a flow chart illustrating the step S410 of compressing weight values of the weight matrix W and indices of input vector X in FIG. 4A.
Figure 4C:
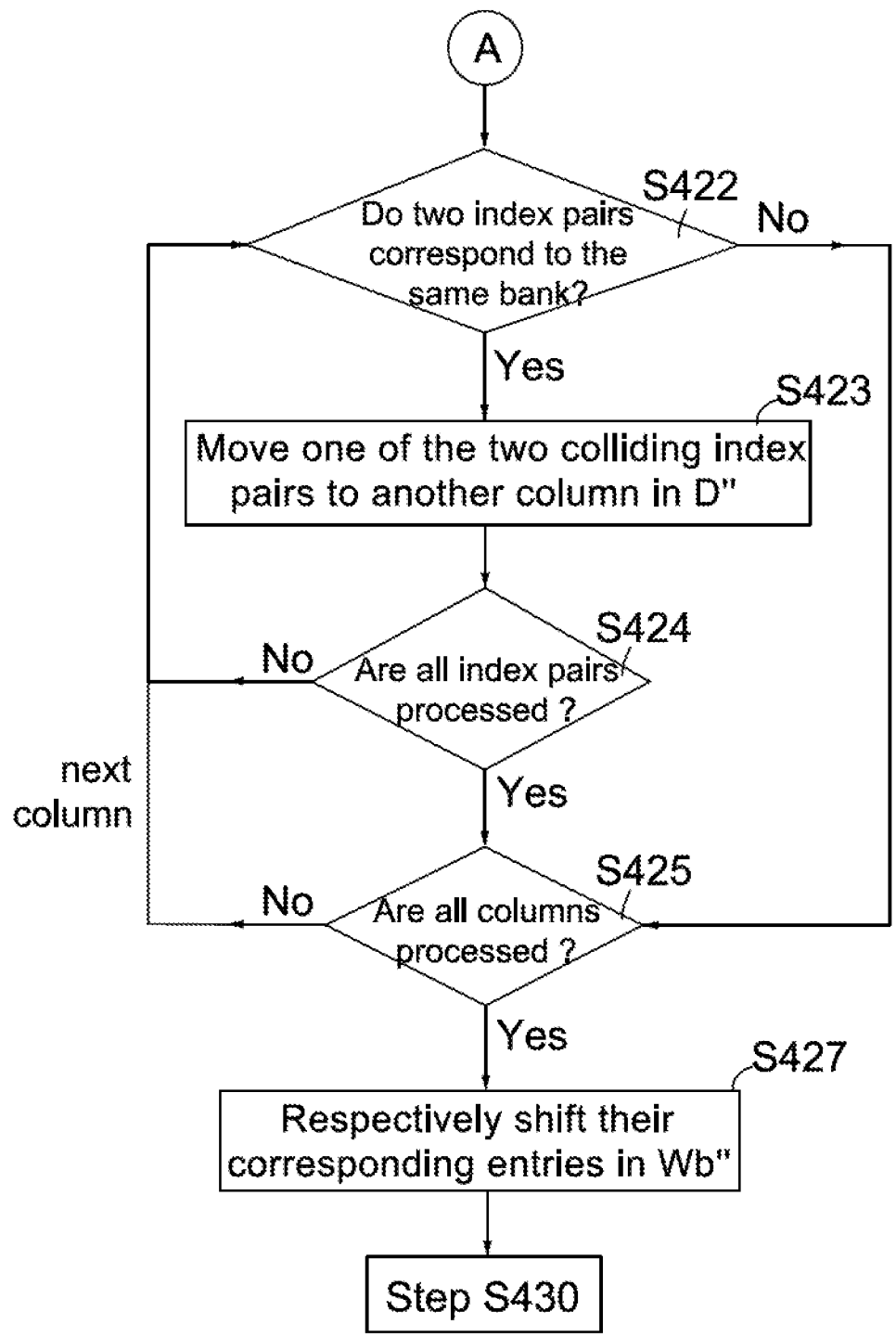
Figure 4D:
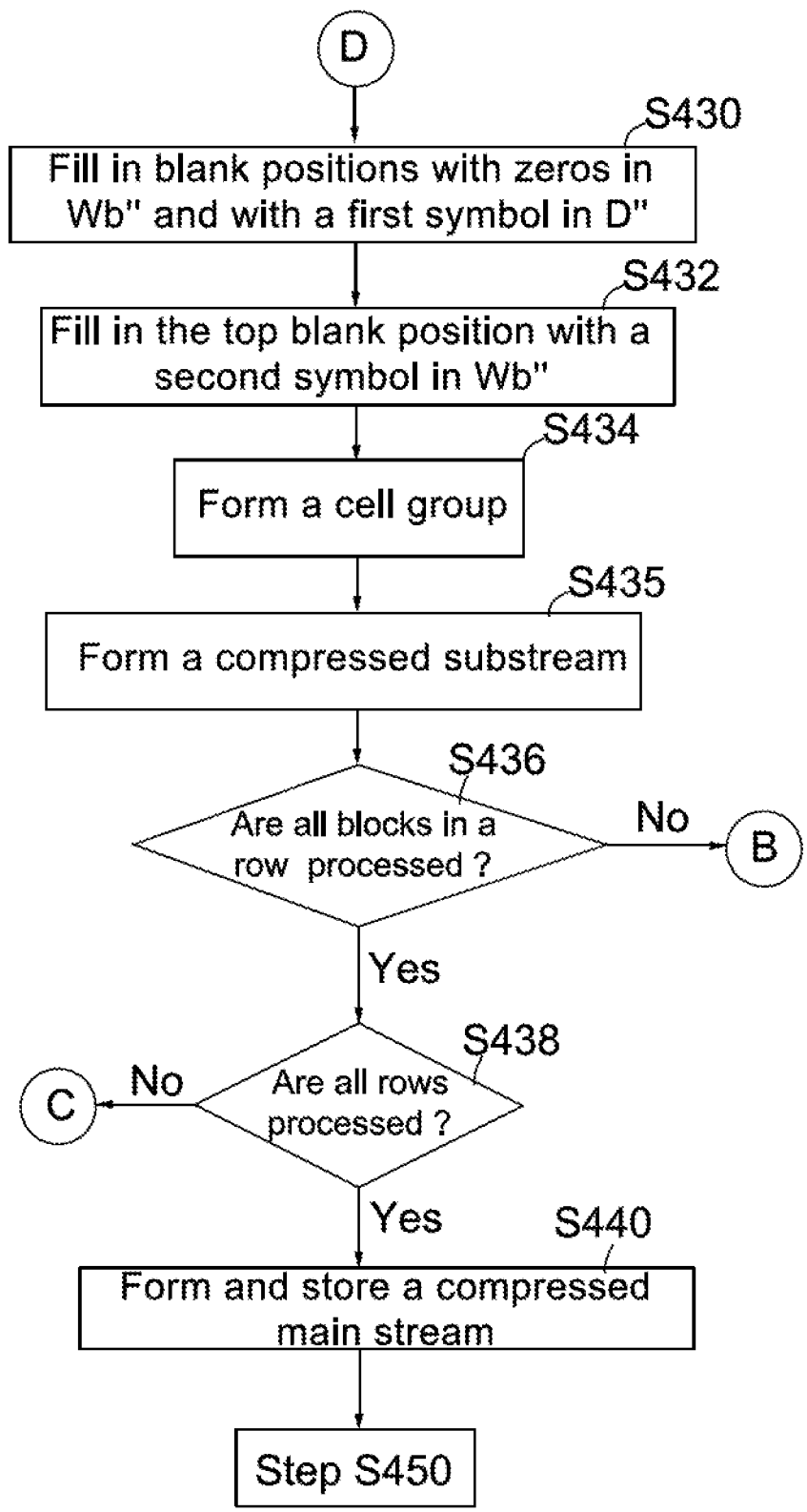

FIGS. 4B-4D show a flow chart illustrating the step S410 of compressing the weight matrix W and indices of the input vector X in FIG. 4A.

Step S412: Divide the weight matrix W into multiple N×L blocks. For example, the 1024×1024 weight matrix W is divided into multiple square 8×8 blocks 20 as shown in FIG. 2.

Step S414: Convert the entries of a target block and corresponding indices of vector X to follow the formats of working block Wb' and working index matrix D'. For example, due to the fact that a target block 20 at the top-left corner of the weight matrix W in FIG. 2 is related to x[0]~x[7], the entries of the target block 20 and related indices 0~7 of vector X are converted to follow the formats of Wb' 320 and D' 310 in FIG. 3C. FIG. 5A shows an example of a working block Wb' 520 and a working index matrix D' 310 with the entries of the target block 20 and related indices 0~7 of vector X loaded and converted. Referring to the example of FIG. 5A, after the raw entries of the target block 20 and related indices 0~7 of vector X are loaded and converted, the corresponding working block Wb' 520 is shown as a dense representation in which a lot of zero entries are included and non-zero entries are clustered.

Step S416: Remove/skip zero entries in the working block Wb'. In a general ANN system, non-zero entries are sparse and clustered in the weight matrix W. Since there are a lot of zero entries in block Wb' 520 and zero is a multiples of any number, the zero entry(ies) are skipped/removed in the working block Wb' 520 FIG. 5A. Besides, their corresponding entries (residing at the same position in D' 310 as the zero entries in Wb' 520) in the working index matrix D' 310 are also skipped/removed. The positions where the zero entry(ies) are removed in the working block Wb' and the positions where the corresponding entries are removed in the working index matrix D' 310 are left blank.

Figure 5B:
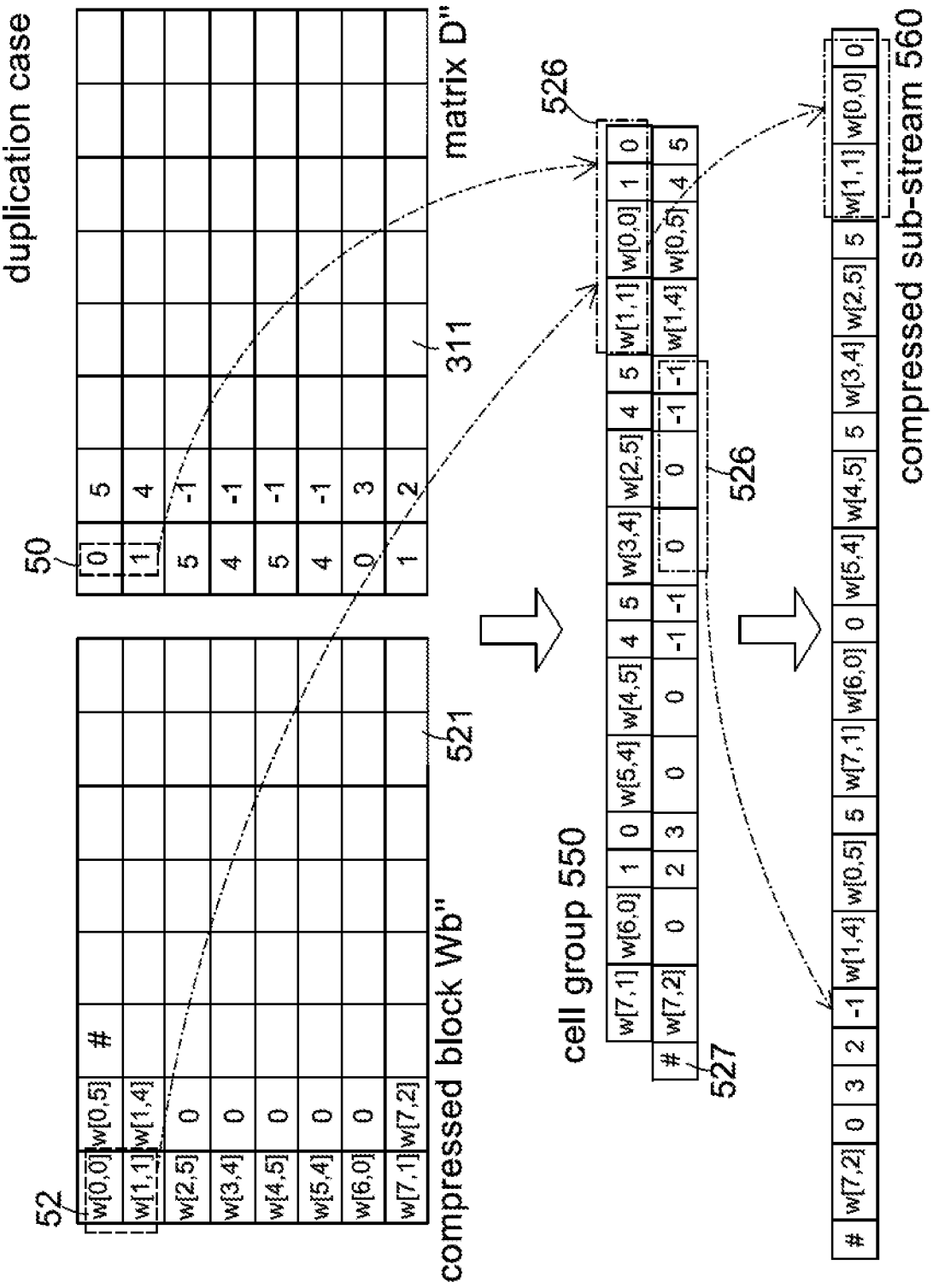
FIG. 5B shows a compressed block Wb" 521 and a compressed index matrix D" 311 according to the example of FIG. 5A with the memory controller 120B in the duplication configuration.
Figure 5C:
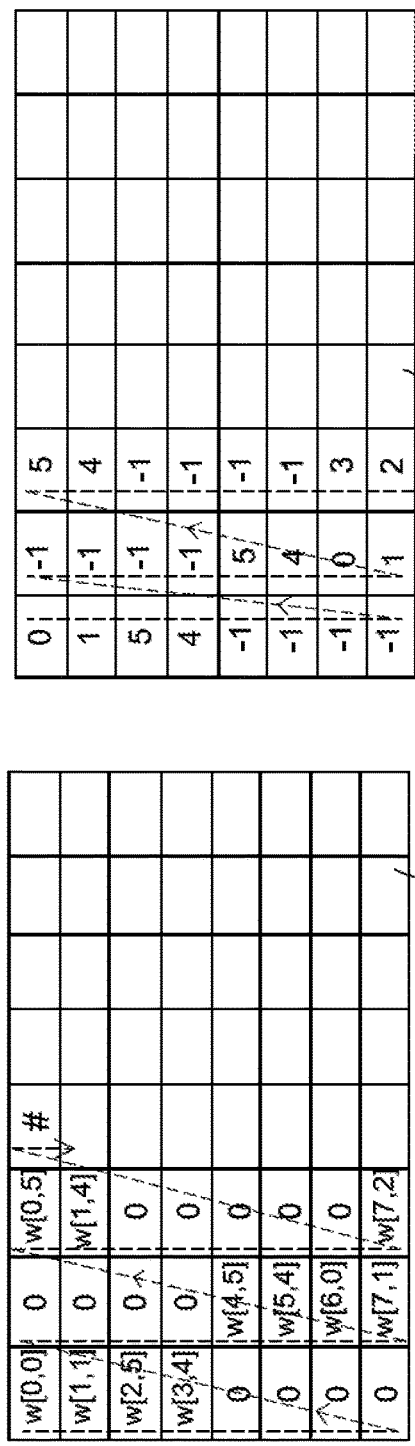
FIG. 5C shows a compressed block Wb" 522 and a compressed index matrix D" 312 according to the example of FIG. 5A with the memory controller 120A in the non-duplication configuration.

FIG. 5B shows a compressed block Wb" 521 and a compressed index matrix D" 311 according to the example of FIG. 5A with the memory controller 120B in the duplication configuration. FIG. 5C shows a compressed weight matrix Wb" 522 and a compressed index matrix D" 312 according to the example of FIG. 5A with the memory controller 120A in the non-duplication configuration. Here, the entries in each column of matrix D" 311/312 are arranged to form in a plurality of index pairs 50 (in vertical direction). Please note that given that the memory controller 120B supports synapse value duplication (i.e., in the duplication configuration) in the example of FIG. 5B, any two or more index pairs 50 in a column of matrix D" 311 are allowed to correspond to the same SRAM bank. Meanwhile, since the memory controller 120A does not support synapse value duplication (i.e., in the non-duplication configuration)

in the example of FIG. 5C, all the index pairs 50 in a column of matrix D" 312 need to correspond to different SRAM banks and thus the three index pairs (5,4) are scattered to different columns as shown in D" 312. Please also note that the index pairs with their indices swapped, such as (5,4) and (4,5), are regarded as corresponding to the same SRAM bank based on configurations of the SRAM banks 111~114.

Step S418: Sequentially shift the non-zero entry(ies) row by row to their leftmost blank positions in the working block Wb'. For example, the weight pair (w[0,5], w[1,4]) are shifted from the $5^{th}$ column in Wb' 520 to the first column in Wb" 521 and the weight pair (w[2,5], w[3,4]) are shifted from the 3rd column in Wb' 520 to the 0th column in Wb" 521. However, sequentially shift the non-zero entry(ies) row by row to their leftmost blank positions is provided by way of example and not limitation of the invention. In an alternative embodiment, the non-zero entry(ies) can be sequentially shift row by row to their rightmost blank positions in the compressed block Wb".

Step S420: Respectively shift their corresponding entries (residing at the same position in the working index matrix D' as the non-zero entries in the working block Wb') to their corresponding positions in the working index matrix D'. This causes the non-zero entries in the $i^{th}$ row of Wb" 521 and their corresponding entries in the $i^{th}$ row of D" 311 to locate in the same column, for i=0~7. This step is used to maintain the one-to-one position correspondence between entries of D" 311 and Wb" 521.

Step S421: Check whether L>N or the memory controller 120 is in non-duplication configuration. If L>N or the memory controller 120 is in non-duplication configuration, the flow goes to step S422; if L=N and the memory controller 120 is in duplication configuration, the flow goes to step S430.

Step S422: Check column-by-column whether two or more index pairs in the same column correspond to the same SRAM bank in the compressed index matrix D". If YES, the flow goes to step S423; otherwise, the flow goes to step S425. As the example of matrix D" 311 in FIG. 5B (where the step S420 is done), there are two index pairs (5,4) and two index pairs (0,1) colliding in the $0^{th}$ column. Specifically, two index pairs (5,4) correspond to the same SRAM bank 113 and two index pairs (0,1) correspond to the same SRAM bank 111.

Step S423: Move/shift one of the two or more colliding index pairs out of the same column in D". There are two ways to move/shift out one of the two or more colliding index pairs. (1) Continuous shift: based on the step S418 where the non-zero entry(ies) are move to their leftmost blank positions in Wb", shift a target index pair (i.e., one of the two or more colliding index pairs), along with the other index pairs on its right side, to the right by one position, and check whether the target index pair collide with any index pair in a new column. If NO, stop shifting; if YES, continue shifting to the right by one position until the target index pair do not collide with any index pair in a new column. (2) Direct swap: if it is confirmed that there are no such index pair in a different column, directly swap the target index pair with a different index pair in the different column and in the same rows. Referring to FIGS. 5B and 5C, in the non-duplication case or L>N case, one of two colliding index pairs (5,4) and one of two colliding index pairs (0,1) with the other index pairs on their right side are shifted from the $0^{th}$ column in D" 311 to the first column in D" 312, and a third index pair (5,4) is shifted from the first column in D" 311 to the second column in D" 312.

Step S424: Determine whether the two or more colliding index pairs in the same column in D" are processed. If NO, return to step S422; if YES, proceed to step S425.

Step S425: Determine whether all columns in D" are processed. If NO, return to step S422; if YES, proceed to step S427.

Step S427: Respectively shift their corresponding non-zero entries (residing at the same position in Wb" 522 as the entries in D" 312) to their corresponding positions in Wb" 522. This step is used to maintain the one-to-one position correspondence between entries of D" 312 and Wb" 522.

Step S430: Fill in blank positions with zeros in the compressed block and with a first symbol in the compressed index matrix. For example, check column-by-column whether there is at least one non-zero entry in a column of the compressed block Wb" 521 in FIG. 5B. If YES, the blank position(s) in the same column (with the at least one non-zero entry) are filled in with zeros and their corresponding positions in D" 311 are filled in with a first symbol or digit, such as "−1". According to the examples of FIGS. 5A and 5B, after step S420, there are three non-zero entries in the first column and five blank positions at the first column and the $2^{nd}$ to $6^{th}$ rows, and thus, the five blank positions at the first column and the $2^{nd}$ to $6^{th}$ row are filled in with zeros in Wb" 521 and filled in with "−1" in D" 311 at this step.

Step S432: Fill in at least one position in the leftmost blank column of Wb" with a second symbol, indicating the end of block (EoB). For example, in FIG. 5B, the top position in the leftmost blank column of the compressed block Wb" 521 is filled in with a number sign (#), indicating the end of block (EoB). Consequently, in the duplication case of FIG. 5B, an eight-element dot-product operations (taking eight clock cycles) for the target block 20 is compressed to a two-element dot-product operations (taking two clock cycles), and thus the hardware (MAC) utilization in the invention is maximized upon computation. Please compare Wb' 520 with Wb" 521, and it is clear that skipping zero entries (step S416) and shifting non-zero entries to their leftmost blank positions (step S418) significantly increase the compression ratio of the compression main stream and hardware (MAC) utilization.

Step S434: Form a cell group by sequentially combining pair-by-pair index pairs 50 in each column in the compressed index matrix D" with their corresponding weight pairs 52 in the compressed block Wb". For example, form a cell group 550 by sequentially combining pair-by-pair index pairs 50 in each column in D" 311 with their corresponding weight pairs 52 in Wb" 521, from the top-left corner to the bottom-right corner of Wb" and D" (such as the dash lines in Wb" and D" of FIG. 5C). The cell group 550 includes two cell rows 570 and an EoB code (e.g., a number sign (#)) 527, indicating the end of block (EoB). Each cell row 570 includes four data cells 526. Each data cell 526 includes an index pair 50 (in vertical direction) in D" and its corresponding weight pair 52 (reside at the same position as the pair 50) in Wb". That is, each cell row 570 in the cell group 550 includes four weight pairs 52 and four index pairs 50 in a corresponding column in Wb" 521 and D" 311.

Step S435: Form a compressed sub-stream by compressing the cell group. The cell group 550(552) is compressed into the compressed sub-stream 560(562) using two features. (1) Each index pair have a difference value of 1: as can be observed from D" 311(312), each index pair with a difference value of 1 (except that the cell (hereinafter called "blank cell") containing two index(or entry) values of −1) are in descending/ascending order, so only the first index for each index pair needs to be recorded in the compressed sub-stream 560(562). (2) Compress blank cells: "−1" in the compressed sub-stream 560 is used to represent one blank cell in the cell group 550(552) and the number subsequent to "−1" in the compressed sub-stream 560(562) is used to indicate the number of consecutive blank cells in the cell group 550(552). The above two features further increase the compression ratio of the compressed main stream.

Step S436: Determine whether all the blocks 20 in a horizontal row of the grid in FIG. 2 are processed. If NO, return to step S414 for the next block; if YES, proceed to step S438. All blocks 20 in a horizontal row of the grid in FIG. 2 need to be processed before moving vertically in the grid Step S438: Determine whether all horizontal rows of the grid in FIG. 2 are processed. If NO, return to step S414 for the next block; if YES, proceed to step S440.

Figure 6:
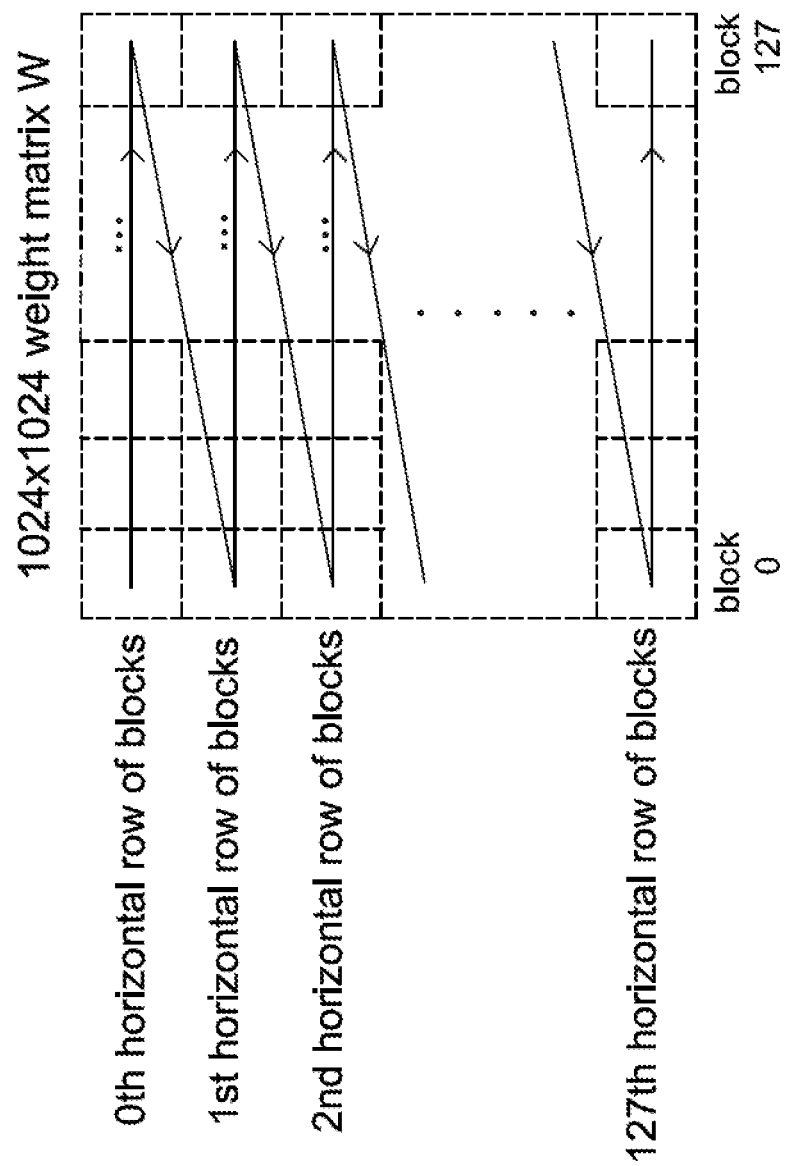
FIG. 6. is a scanning and connecting sequence of compressed sub-streams for all the blocks of the weight matrix W in FIG. 2 to form a compressed main stream.

Step S440: Form a compressed main stream by series-connecting the compressed sub-streams of all the blocks together and then store the compressed main stream. Specifically, form a compressed main stream by series-connecting the compressed sub-streams of all the blocks 20, sequentially from the $0^{th}$ block to the $127^{th}$ block in the $0^{th}$ horizontal row and then from the $0^{th}$ horizontal row to the $127^{th}$ horizontal row of the gird as the connecting sequence shown in FIG. 6. In other words, the compressed sub-streams of all the blocks are scanned in "z" order and then series-connected to form the compressed main stream. Afterward, the compressed main stream is stored in the storage device 160. The storage device 160 includes all forms of non-volatile memory, media and memory devices.

On the other hand, in FIG. 2, the 1024×1024 weight matrix W is divided into multiple 8×8 blocks 20. Since each block 20 is multiplied by eight entries of the input vector X, relative index for eight entries of vector X ranges from 0 to 7. Even for the last fragment of the input vector X (index number: 1016~1023), its index base is equal to 1016 and its relative index still ranges from 0 to 7. Due to the fact that the entries of the input vector X are processed in sequence (i.e., eight entries at a time), there is no need to record the index base for each segment of the input vector X; instead, the index base is calculated by the decompression module 170 in real time. Thus, the bit length necessary to represent the indices for each segment (i.e., eight entries) of the input vector X (i.e., entries in the working index matrix D' 310 or D" 311/312 for each block 20) is only three ($\log_2 8$) bits in the example of FIG. 2. This feature is called "fully relative indexing" in this specification, which rather increases the compression ratio of the compression main stream. In an alternate embodiment, the weight matrix W is divided into multiple rectangular N×L sub-matrices/blocks, and the bit length necessary to represent the indices for each segment (i.e., L entries) of the input vector X (i.e., entries in the working index matrix D' for each block) is ($\log_2 L$).

In the non-duplication case of FIG. 5C, after the step S432 is done, block Wb" 522 and matrix D" 312 are produced; after the step S434 is done, the cell group 552 is formed according to block Wb" 522 and matrix D" 312; after the step S435 is done, the cell group 552 is compressed into the compressed sub-stream 562. Consequently, an eight-element dot-product operations (taking eight clock cycles) for the target block 20 is compressed to a three-element dot-product operations (taking three clock cycles). Thus, the compression ratio of the compression main stream and the hardware (MAC) utilization in the invention are also improved.

Please refer back to FIG. 4A.

Step S450: Store a set of synapse values into a SRAM device in an interleaved manner. According to their indices, a set of synapse values (corresponding to the input vector X in FIG. 2) are stored in the four SRAM banks 111~114 in an interleaved manner in FIG. 1A. Therefore, the four SRAM banks 111~114 outputs eight synapse values within a clock cycle and the computing apparatus 100 can make full use of the eight synapse values.

Step S452: Decompress the compressed main stream. In an embodiment, the decompression module 170 decompresses the compressed main stream from the storage device 160 block-by-block into a series of cell groups. As stated above, since each compressed sub-stream is ended with the EoB code (i.e., #), it is easy for the decompression module 170 to identify the end of each compressed sub-stream for each block 20.

Step S454: Write eight weight values to the data buffer 140. Given that the decompression module 170 decompresses the compressed sub-stream 562 (out of the compressed main stream) into the cell group 552 in FIG. 5C, the cell group 552 are processed row-by-row by the computing apparatus 100. As mentioned above, since the entries of input vector X is processed in sequence (i.e., eight entries at a time), there is no need to record the index base for each segment of the input vector X; instead, the index base is calculated by the decompression module 170 in real time. Thus, for the four data cells 526 in the $0^{th}$ cell row 570 of the cell group 552, the decompression module 170 calculates the index base equal to 0 (because it is $0^{th}$ block in the $0^{th}$ horizontal row of the grid in FIG. 2) in real time, adds the index base to their four index pairs to obtain four modified index pairs and then transmits the four modified index pairs to the memory controller 120B; besides, the decompression module 170 sequentially writes their eight weight values (four weight pairs) to four fixed memory locations (each containing two values) in the data buffer 140 for temporary storage. Please note that if any of the index pair is (−1,−1) in the cell group, the decompression module 170 bypasses the index pair (−1,−1) to the memory controller 120B without adding the index base.

Figure 1C:
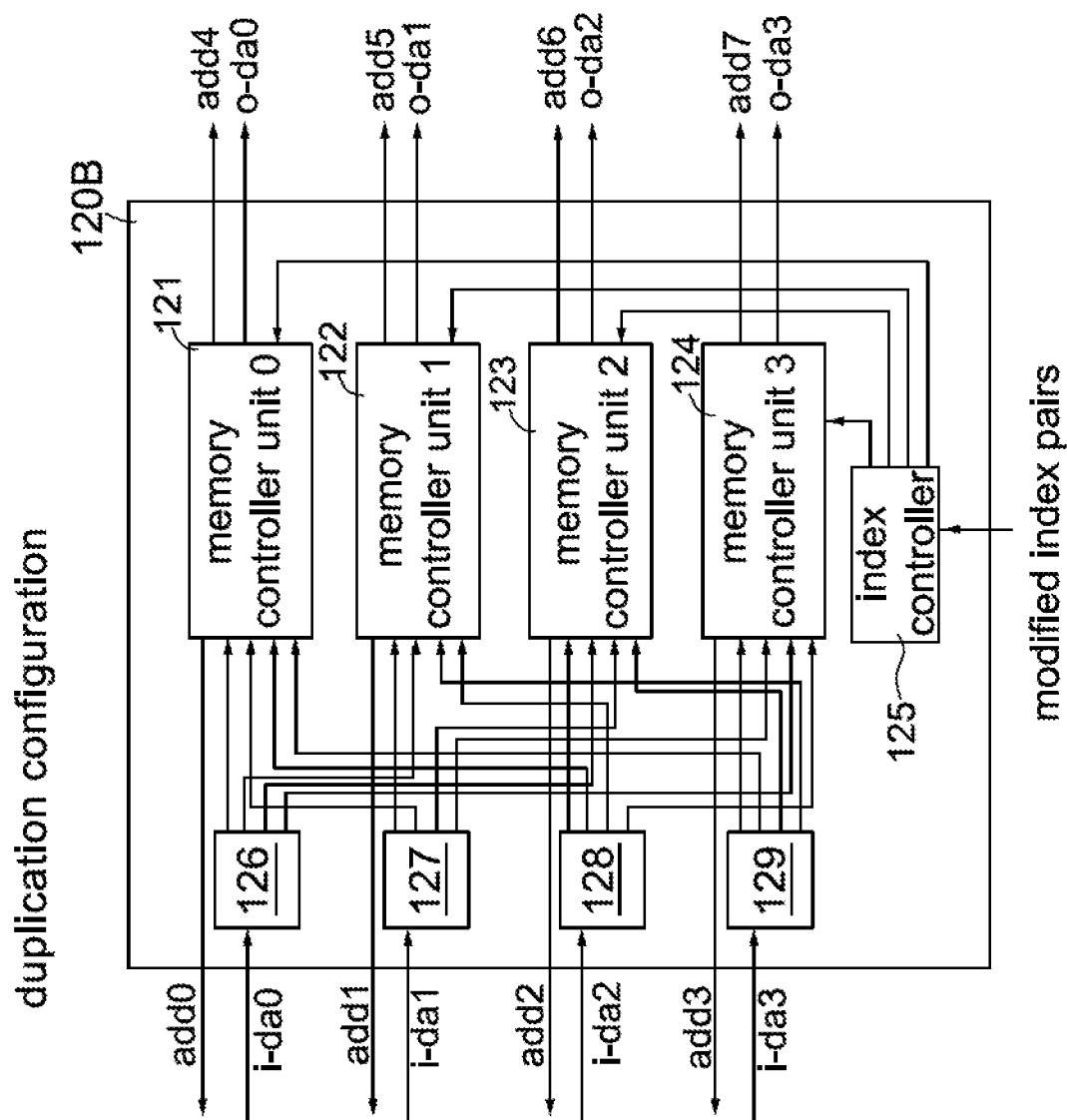
FIG. 1C is a block diagram of a memory controller with duplication configuration based on the computing apparatus of FIG. 1A.

Step S456: Read out eight synapse values in a single clock cycle according to a cell row in one of the cell groups. In FIGS. 1B-1C, the index controller 125 receives four modified index pairs derived from a cell row in the cell group at a time, converts each modified index pair into a set of control parameters (bn, bi, ds) and respectively transmits the four sets of control parameters to four memory controller units (121~124), where the parameter bn denotes a SRAM bank number (bn=0~3), the parameter bi denotes the index number of the SRAM bank and the parameter ds denotes whether two indices in a corresponding modified index pair need to be swapped. In one embodiment, if the modified index pair (such as (0,1)) are in an ascending order, the parameter ds is set to 0 by the index controller 125; otherwise, if the modified index pair (such as (5,4)) are in an descending order, the parameter ds is set to 1. For example, the index controller 125 converts a modified index pair (5,4) into three control parameters (bn=2, bi=0, ds=1) due to the modified index pair (5,4) stored in index 0/SRAM bank 113 and in an descending order.

In a non-duplication case that the decompression module 170 decompresses the compressed sub-stream 562 into the cell group 552, the index controller 125 processes four data cells 526 in each cell row 570 of the cell group 552 in FIG. 5C at a time. Specifically, the index controller 125 receives the $0^{th}$ modified index pair (0, 1) derived from the $0^{th}$ data cell 526 in the $0^{th}$ cell row 570 of the cell group 552, converts the modified index pair (0, 1) into a set of control parameters (bn=0, bi=0, ds=0) and transmits the control parameters to a corresponding memory controller unit 121. Then, the index controller 125 receives the first modified index pair (5, 4) derived from the first data cell 526 in the $0^{th}$ cell row 570 of in the cell group 552, converts the modified index pair (5, 4) into a set of control parameters (bn=2, bi=0, ds=1) and transmits the control parameters to a corresponding memory controller unit 122. However, while receiving the second and third index pairs (−1,−1) derived from the second and third data cell in the $0^{th}$ cell row 570, the index controller 125 directly transmits a set of default control parameters (bn=−1, bi=−1, ds=−1) to their corresponding memory controller units 123~124.

Afterward, the memory controller units 121 and 122 respectively convert their received control parameters bn and bi into read SRAM addresses add0 and add1, transmit the read SRAM addresses add0 and add1 to the SRAM device 110 and read data i-da0 and i-da1 from the SRAM device 110. Then, due to the parameter ds equal to 0, the memory controller unit 121 directly outputs the input data i-da0 (i.e., x[0],x[1]) as the output data o-da0, along with a write address add4, to one of the four fixed memory locations (each containing two synapse values) in the data buffer 130 for temporary storage. Meanwhile, the memory controller unit 122 needs to swap the input data i-da1 (i.e., x[4],x[5]) due to the parameter ds equal to 1 and outputs the swapped data (i.e., x[5],x[4]) as the output data o-da1, along with a write address add5, to another one of the four fixed memory locations in the data buffer 130 for temporary storage. Besides, due to the parameters bn and bi equal to −1, there is no need for the memory controller units 123~124 to read any data from the SRAM device 110, and the memory controller units 123~124 respectively output zeros as the output data o-da2~o-da3, along with their write addresses add6~add7, to the other memory locations in the data buffer 130 for temporary storage.

Step S458: Perform multiply-accumulate (MAC) operations in parallel. In the embodiment of FIG. 1A, the MACs 150~157 performs the MAC operations in parallel; there are eight output ports in the data buffers 130 and 140, respectively. The eight output ports in the data buffers 130 respectively output eight synapse values in four fixed memory locations and the eight output ports in the data buffers 140 respectively output eight weight values in four fixed memory locations. The $0^{th}$ output ports in the data buffers 130 and 140 are connected to the two input terminals of the MAC 150, the first output ports in the data buffers 130 and 140 are connected to the two input terminals of the MAC 151, . . . , and so forth. Once the data buffers 130 and 140 are written, the MACs 150~157 are activated to perform the MAC operations in parallel.

Step S460: Determine whether this cell group (for this block) is done. If NO, return to steps S454 and S456 for the following four data cells (in the next row of the cell group); if YES, proceed to step S462.

Step S462: Determine whether all the blocks in a horizontal row of the gird is done. If NO, return to steps S454 and S456 for the next block; if YES, proceed to step S464.

Step S464: Reset all accumulators 15c in MACs 150~157. Please note that all accumulation values ac10~ac17 from the accumulators 15c in MACs 150~157 need to be written to an external memory device (not shown) for storage before all accumulators 15c in MACs 150~157 are reset. Provided that a $0^{th}$ horizontal row of the grid in FIG. 2 is done, the accumulation values ac10~ac17 equal to the entries y[0]~y[7] of the output vector Y are written to the external memory device for storage, and then the all accumulators 15c in MACs 150~157 are reset for processing the first horizontal row of the grid (i.e., for computing the following entries y[8]~y[15]).

Step S466: Determine whether all the horizontal rows of the gird are done. If NO, return to steps S454 and S456 for the next row; if YES, the flow is terminated.

In a duplication case that the decompression module 170 decompresses the compressed sub-stream 560 into the cell group 550 in FIG. 5B, the index controller 125 processes four data cells 526 in each cell row 570 of the cell group 550 at a time. At step S456, the index controller 125 receives the 0th and the 3rd modified index pairs (0,1) derived from the $0^{th}$ and the 3rd data cell 526 in the $0^{th}$ cell row 570 of the cell group 550, converts the modified index pairs (0,1) into a set of control parameters (bn=0, bi=0, ds=0) and transmits the control parameters to their corresponding memory controller units 121 and 124. Meanwhile, the index controller 125 receives the first and the $2^{nd}$ modified index pairs (5,4) derived from the first and the $2^{nd}$ data cells 526 in the $0^{th}$ cell row 570 of the cell group 550, converts the modified index pairs (5, 4) into a set of control parameters (bn=2, bi=0, ds=1) and transmits the control parameters to their corresponding memory controller units 122 and 123. Since the memory controller unit 121 and the memory controller unit 124 have the same read SRAM address due to the received same modified index pair (0,1), one of the memory controller unit 121 and 124, such as unit 121, is arranged to issue a read SRAM address add0 to the SRAM device 110 and then the SRAM device 110 outputs data i-da0 (i.e., x[0],x[1]) to the data register 126. Next, the memory controller units 121 and 124 are arranged to read the data i-da0 (i.e., x[0],x[1]) from the data register 126, and directly output the input data i-da0 as the output data o-da0 and o-da3, along with write address signals add4 and add7, to the $0^{th}$ and $3^{rd}$ memory locations (each storing two synapse values) in the data buffer 130 in view of ds=0.

Likewise, since the memory controller unit 122 and the memory controller unit 123 have the same read SRAM address due to the received same modified index pair (5,4), one of the memory controller unit 122 and 123, such as unit 122, is arranged to issue a read SRAM address add1 to the SRAM device 110 and then the SRAM device 110 outputs data i-da1 (i.e., x[4],x[5]) to the data register 127. Next, the memory controller units 122 and 123 are arranged to read the data i-da1 (i.e., x[4],x[5]) from the data register 127, swap the data i-da1 in view of ds=1 and output the swapped data (i.e., x[5],x[4]) as the output data o-da1 and o-da2, along with write address signals add5 and add6, to the 1st and 2nd memory locations (each containing two synapse values) in the data buffer 130.

Figure 7:
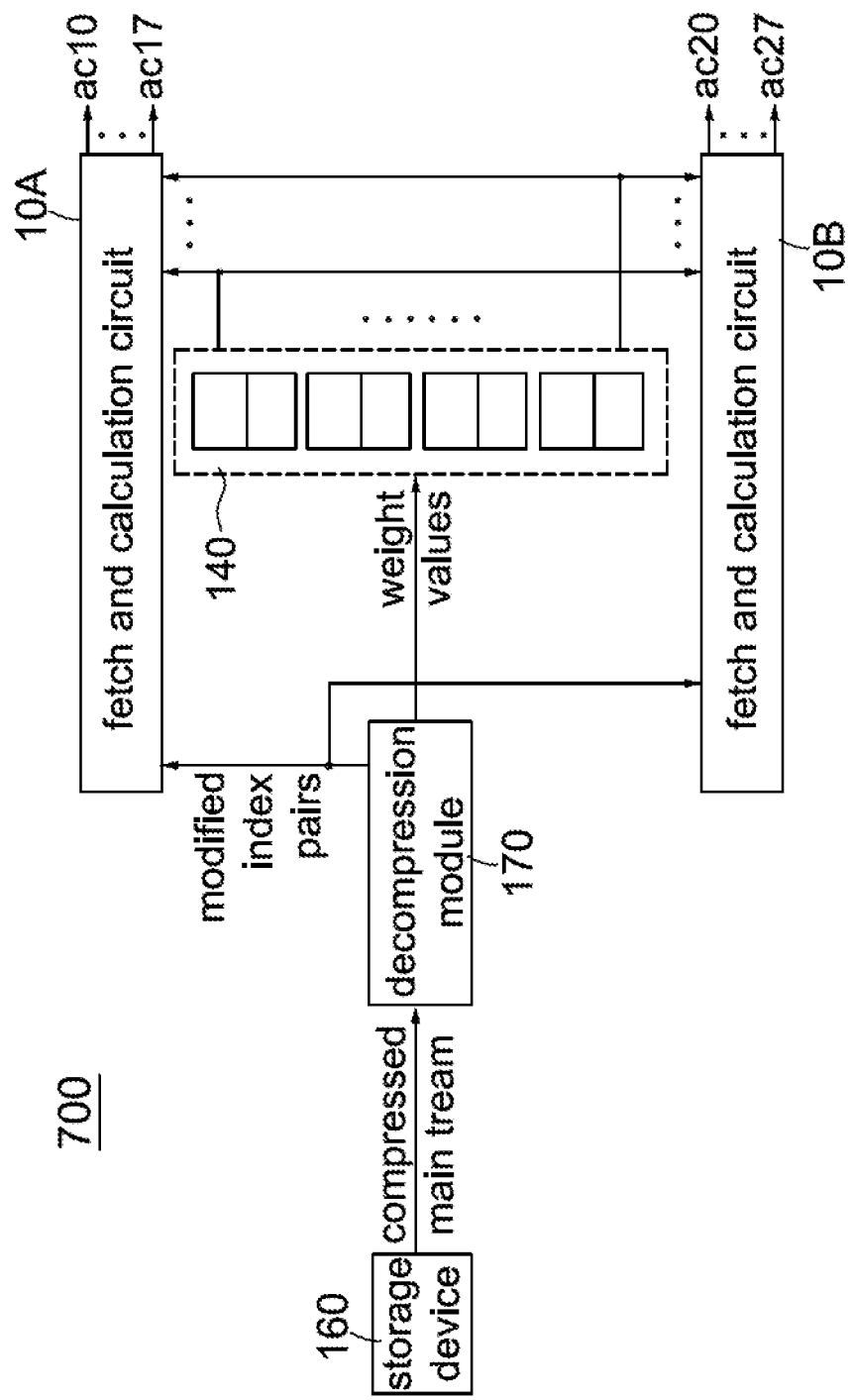
FIG. 7 is a schematic diagram of a computing apparatus for two synapse data streams according to another embodiment of the invention.

Although the embodiments of FIGS. 1A and 4A are described in terms of a weight matrix (or a compressed main stream) with a single synapse data stream (i.e., a set of synapse values stored in the SRAM device 110), it should be understood that embodiments of the invention are not so limited, but generally applicable to a weight matrix (or a compressed main stream) with multiple synapse data streams (i.e., multiple sets of synapse values). In fact, the compressed main stream is only related to non-zero weight values of the weight matrix W and indices (or corresponding index numbers) of the input vector X, rather than to any synapse values; hence, the compressed main stream is applicable to a single synapse data stream as well as multiple synapse data streams. For example, in a two-data-stream case as shown in FIG. 7, it is easy for the circuitry of the computing apparatus 700 to be implemented using two identical fetch and calculation circuits 10A and 10B for the two synapse data streams; accordingly, the hardware and the compressed main stream can operate in conjunction with the two synapse data streams concurrently. In FIG. 7, the two fetch and calculation circuits 10A and 10B have the identical components, but respectively process two synapse data streams (pre-stored in two different SRAM devices) according to the same compressed main stream. Regarding FIG. 7, two sets of synapse values are respectively stored into two SRAM devices 110 (corresponding to step 450); sixteen synapse values are read out in parallel from the two SRAM devices 110 in the two fetch and calculation circuits 10A and 10B according to the same cell row in one of the cell groups (corresponding to step 456); the MACs 150~157 in the two fetch and calculation circuits 10A and 10B perform the MAC operations in parallel (corresponding to step 458) to obtain the accumulation values ac10~ac17 and ac20~ac27.

Although the above embodiments are described in terms of a layer comprising multiple neurons with multiple inputs in a general ANN system, it should be understood that embodiments of the invention are not so limited, but generally applicable to any layers or structures in any ANN system that need to perform M×V operations, such as fully connected (FC) layers in convolutional neural networks, recurrent neural networks, and the like.

The above embodiments and functional operations can be implemented in digital electronic circuitry, in tangibly-embodied computer software or firmware, in computer hardware, including the structures disclosed in this specification and their structural equivalents, or in combinations of one or more of them. The methods and logic flows described in FIGS. 4A-4D can be performed by one or more programmable computers executing one or more computer programs to perform their functions. The methods and logic flows in FIGS. 4A-4D can also be performed by, and the computing apparatus 100/700 can also be implemented as, special purpose logic circuitry, e.g., an FPGA (field programmable gate array) or an ASIC (application-specific integrated circuit). Computers suitable for the execution of the one or more computer programs include, by way of example, can be based on general or special purpose microprocessors or both, or any other kind of central processing unit. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A method for matrix by vector multiplication, applied in an artificial neural network system, comprising:
compressing a plurality of weight values in a weight matrix and indices of an input vector into a compressed main stream;
respectively storing M sets of synapse values in M memory devices; and
performing reading and multiply-accumulate (MAC) operations according to the M sets of synapse values and the compressed main stream to obtain a number M of output vectors in parallel;
wherein the step of compressing comprises:
dividing the weight matrix into a plurality of N×L blocks;
respectively converting entries of a target block selected from the N×L blocks and corresponding indices of the input vector into a working block and an index matrix such that one of multiple entries of each output vector is related to a corresponding row in the working block and the index matrix;
removing zero entries in the working block;
sequentially shifting non-zero entries row-by-row to one of their left and right sides in the working block;
respectively shifting corresponding entries in the index matrix;
forming a compressed sub-stream associated with the target block according to the shifted working block and the shifted index matrix; and
repeating the steps of respectively converting, removing, sequentially shifting the non-zero entries, respectively shifting the corresponding entries and forming until all of the N×L blocks are processed to form the compressed main stream;
wherein a bit length for the entries of the index matrix for each block is $\log_2 L$, and L and N are even numbers.

2. The method according to claim 1, which is applicable to a layer comprising multiple neurons with multiple inputs in the artificial neural network system.

3. The method according to claim 1, wherein each of M memory devices is a static random access memory (SRAM) device, each of which is divided into multiple SRAM banks.

4. The method according to claim 3, wherein the step of compressing further comprises:
before the step of forming the compressed sub-stream, moving one of two or more index pairs in one column corresponding to the same SRAM bank to another column in the shifted index matrix if the two or more index pairs in one column of the shifted index matrix corresponding to the same SRAM bank are detected; and
respectively shifting corresponding entries in the shifted working block according to the moved index pair in the shifted index matrix;
wherein the entries in each column of the index matrix are arranged in index pairs.

5. The method according to claim 4, wherein L>N.

6. The method according to claim 1, wherein the step of storing the M sets of synapse values in the M memory devices further comprises:
storing each of the M sets of synapse values in each of the M memory devices in an interleaved manner such that each of the M memory devices outputs a number N of synapse values concurrently.

7. The method according to claim 6, wherein each column of the index matrix has N different entries, and each row of has L different entries.

8. The method according to claim 1, wherein the step of sequentially shifting non-zero entries further comprises:
sequentially shifting the non-zero entries row-by-row to one of their leftmost blank positions and their rightmost positions in the working block.

9. The method according to claim 1, further comprising:
storing the compressed main stream in a storage device; and
decompressing the compressed main stream from the storage device into a series of cell groups.

10. The method according to claim 9, wherein the step of performing the reading and the MAC operations comprises:

reading out a number N of synapse values from each of the M memory devices in parallel according to a cell row of a target cell group;

reading out a number N of weight values from the cell row of the target cell group;

for each of the M sets of synapse values, performing a number N of MAC operations in parallel according to the number N of weight values and the number N of synapse values to generate a number N of accumulation values; and repeating the steps of reading out the number N of synapse values, reading out the number N of weight values and performing the number N of MAC operations until all the cell rows of all the cell groups are processed to obtain the number M of output vectors in parallel;

wherein each cell group comprises at least one cell row, and each cell row corresponds to a corresponding column in the shifted index matrix and the shifted working block.

11. The method according to claim 1, wherein the step of compressing further comprises:

filling in blank positions with zeros in the shifted working block and with a predefined symbol in the shifted index matrix after the step of respectively shifting the corresponding entries in the index matrix and before the step of forming the compressed sub-stream.

* * * * *